United States Patent
Chang et al.

(10) Patent No.: US 6,435,943 B1
(45) Date of Patent: Aug. 20, 2002

(54) METHOD OF CHEMICAL MECHANICAL POLISHING ORGANIC SILICON MATERIAL WITH LOW DIELECTRIC CONSTANT

(75) Inventors: Ting-Chang Chang; Po-Tsun Liu, both of Hsinchu (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/704,190

(22) Filed: Nov. 1, 2000

(30) Foreign Application Priority Data

Oct. 26, 2000 (TW) .......................................... 89122539

(51) Int. Cl.$^7$ ................................................ B24B 1/00
(52) U.S. Cl. ............................ 451/28; 451/54; 451/57; 451/41
(58) Field of Search ........................... 451/28, 41, 57, 451/53, 54, 36; 438/629, 692, 693, 631, 633, 751, 754, 756

(56) References Cited

U.S. PATENT DOCUMENTS

| | | | | |
|---|---|---|---|---|
| 4,042,419 A | * | 8/1977 | Heinke et al. | 451/53 |
| 4,129,457 A | * | 12/1978 | Basi | 451/54 |
| 5,203,883 A | * | 4/1993 | Perry | 451/36 |
| 5,759,087 A | * | 6/1998 | Masumura et al. | 451/41 |
| 5,775,980 A | * | 7/1998 | Sasaki et al. | 451/285 |
| 6,261,952 B1 | * | 7/2001 | Ngo et al. | 438/687 |
| 6,316,364 B1 | * | 11/2001 | Kubo | 451/57 |
| 2001/0008828 A1 | * | 7/2001 | Uchikura et al. | 451/41 |
| 2001/0030367 A1 | * | 10/2001 | Noguchi et al. | 257/758 |

FOREIGN PATENT DOCUMENTS

| | | | | |
|---|---|---|---|---|
| JP | 00002140923 A | * | 5/1990 | 216/67 |
| JP | 02001053076 A | * | 2/2001 | H01L/21/3205 |

* cited by examiner

Primary Examiner—Joseph J. Hail, III
Assistant Examiner—Hadi Shakeri
(74) Attorney, Agent, or Firm—J. C. Patents

(57) ABSTRACT

A method of chemical mechanical polishing organic silicon material with a low dielectric constant. An oxygen plasma treatment is performed on an organic silicon material with a low dielectric constant, so that the carbon contained in the organic silicon material is removed. A chemical mechanical polishing step is performed to planarize the organic silicon material after the oxygen plasma treatment. A ammonia plasma treatment is further performed to mend the damaged portion of the organic silicon material.

19 Claims, 4 Drawing Sheets

METHOD OF CHEMICAL MECHANICAL POLISHING ORGANIC SILICON MATERIAL WITH LOW DIELECTRIC CONSTANT

CROSS-REFERENCE TO RELATED APPLICATION

This application claims the priority benefit of Taiwan application serial no. 89122539, filed Oct. 26, 2000.

BACKGROUND OF THE INVENTION

1. Field of the Invention

The invention relates in general to planarization method. More particularly, this invention relates to method of chemical mechanical polishing (CMP) an organic silicon material with a low dielectric constant.

2. Description of the Related Art

As the line width of semiconductor keeps shrinking, a mass production of ultra-large integrated circuit with high speed, multi-functions, high integration, low power consumption and low cost can be achieved. Due to the increasing integration, the density of interconnects is increased to cause a longer the resistance-capacitance delay (RC delay) to reduce the device speed. Therefore, materials with low dielectric constant have been used as the insulation layers between the interconnects to decrease the stray capacitance between conductive lines, and to result in a higher operation speed of the device.

Currently, the commonly used material with a low dielectric constant includes polymer chemical compound such as the organic silicon compound having the Si—$R_n$ bond (R is the functional group, n equal to 1 or 2), for example, the polysiloxane compound is an example. This kind of material can be formed on a substrate via spin coating followed by baking and curing. The material of methylsilsequioxane (MSQ) with a dielectric constant of about 2.6 to 2.8 with Si-$Ch_3$ bond is frequently used in the advanced semiconductor fabrication process. On the other hand, due to the reduction in size for devices, the exposure depth is inevitably reduced, so that the planarization step becomes a crucial step for fabricating multilevel interconnection. Among the current available planarization processes, chemical mechanical polishing is one the best methods to achieve a global planarization. Therefore, the chemical mechanical polishing performed on the organic silicon material with a low dielectric constant becomes critical in the later part of the fabrication process.

The organic silicon material with a low dielectric layer is a high carbon content polymer. While polishing such material with the slurry for polishing silicon oxide thin film, the polishing rate is significantly reduced due to the high carbon content. Moreover, scratches and non-uniformity on the polished surface are very likely to occur. Therefore, a new slurry has to be developed to provide a better polishing results. However, many experiments and analysis are still required to find out the appropriate slurry that would increase the polishing rate without damaging the polished surface.

SUMMARY OF THE INVENTION

The invention provides a method of chemical mechanical polishing an organic silicon material with a low dielectric constant. An organic silicon material with a low dielectric constant is formed on a substrate. An oxygen plasma treatment is performed on the organic silicon material to remove carbon content from the organic silicon material. A chemical mechanical polishing process is performed on the organic silicon material after the oxygen plasma treatment. An ammonia plasma treatment is further performed to mend the damages of the organic silicon material.

By the above method provided by the invention, the carbon content is removed prior to performing the chemical mechanical polishing process. Therefore, the polishing rate is enhanced. By performing the ammonia plasma treatment, the damages caused by the oxygen treatment, or even by chemical mechanical polishing can be mended to reduce low leakage current of the polished surface.

Both the foregoing general description and the following detailed description are exemplary and explanatory only and are not restrictive of the invention, as claimed.

DESCRIPTION OF THE PREFERRED EMBODIMENTS

Figure 1:
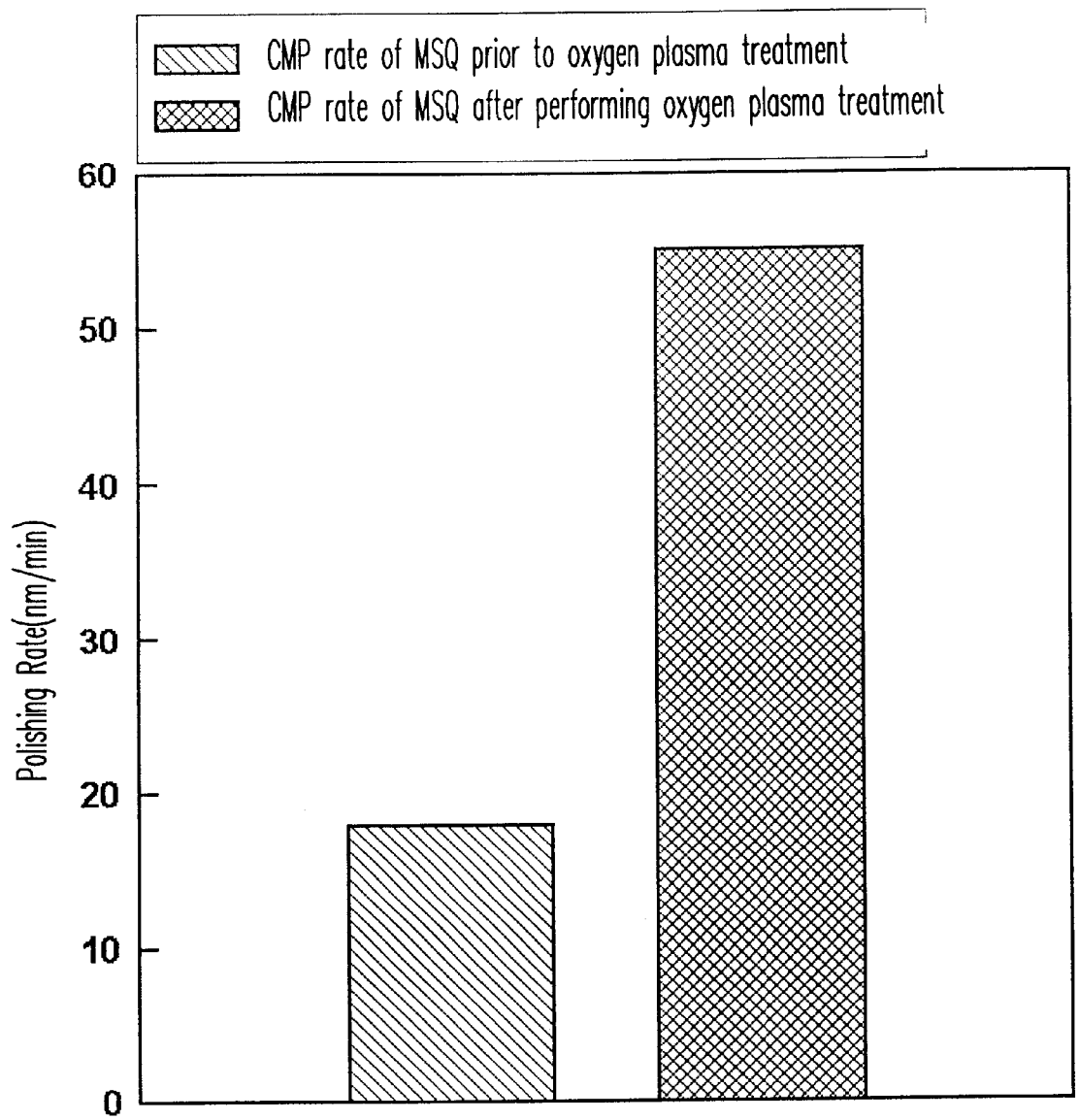
FIG. 1 shows a comparison of polishing rates for a MSQ thin film with and without performing the step of oxygen plasma treatment.
Figure 2:
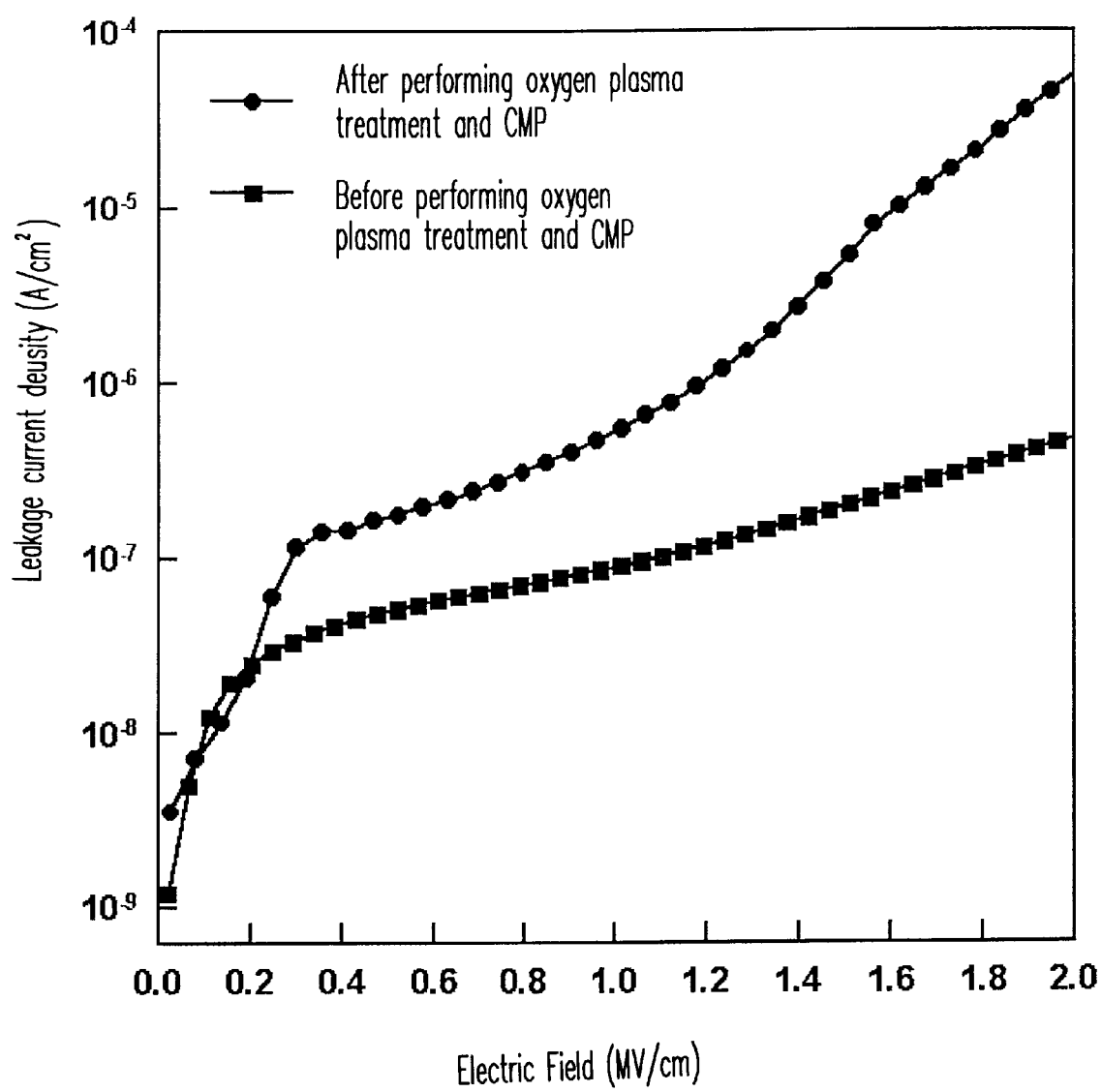
FIG. 2 shows a comparison of leakage current for MSQ thin film before and after the oxygen treatment and the chemical mechanical polishing process.
Figure 4:
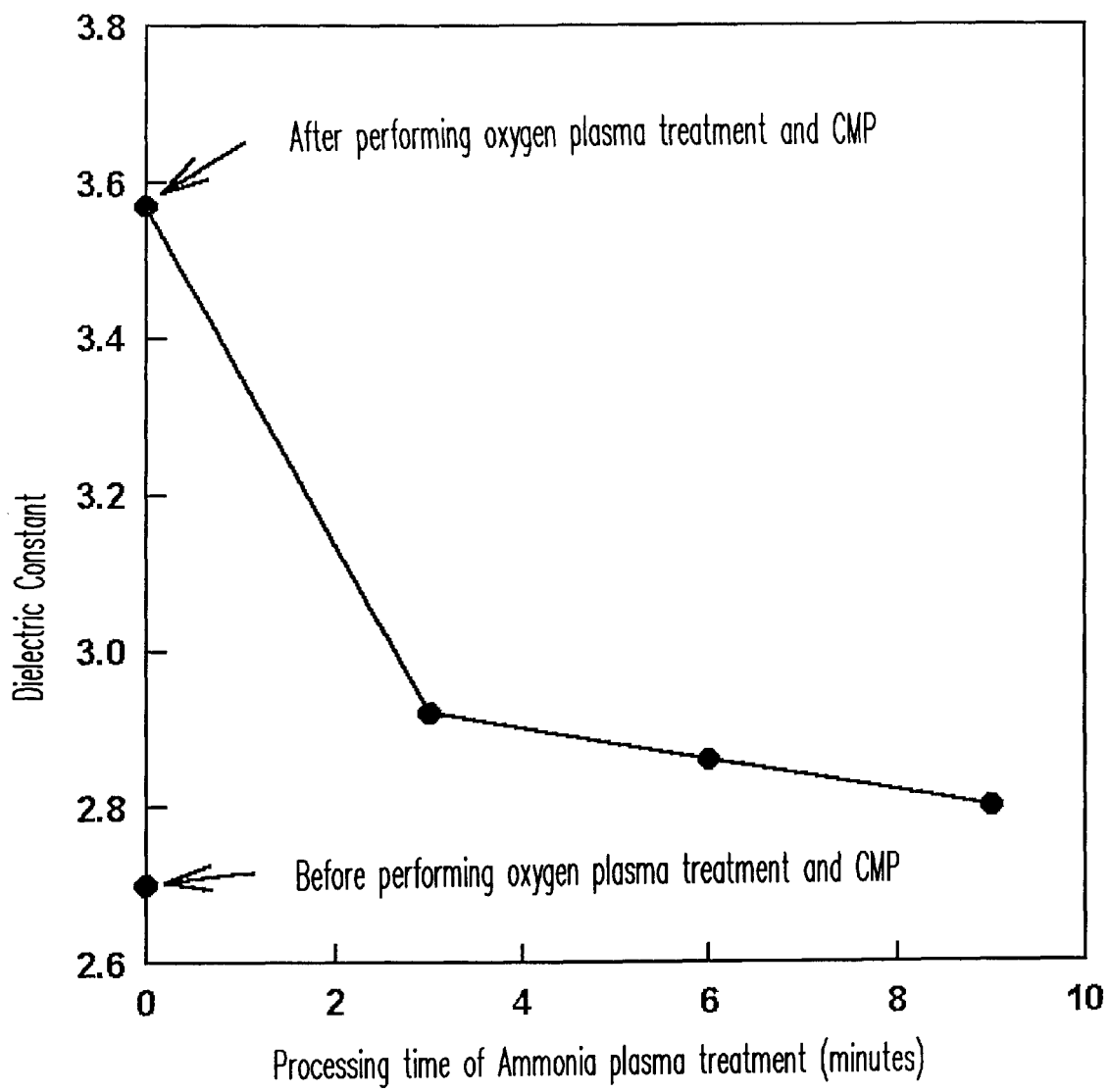
FIG. 4 shows a comparison of dielectric constant for MSQ thin film being performing with the oxygen treatment, chemical mechanical process and ammonia plasma treatment, MSQ thin film being performed with the oxygen treatment and chemical mechanical process and the MSQ thin film prior to performing the oxygen treatment, chemical mechanical polishing process and the ammonia plasma treatment.

Recently, a method of performing an oxygen plasma pre-treatment prior to chemical mechanical polishing has been developed. After performing the oxygen plasma pre-treatment, the carbon contained within the organic silicon material is removed. Therefore, using the polishing pad and the slurry used for polishing silicon dioxide, the organic silicon material can be polished in a faster rate. Referring to FIG. 1, the MSQ thin film has a polishing rate three times faster than that of the MSQ thin film prior to the oxygen plasma treatment. However, when the removal depth of the CMP process is not the same as the depth that the oxygen plasma reaches, the insufficient polishing depth may results in damaged MSQ thin film. A very high leakage current or a very high dielectric constant are thus easily to resulted as shown in FIG. 2 and FIG. 4 (the first point of the curve).

An organic silicon thin film, for example, a MSQ thin film, is coated on a wafer. At a relatively low temperature, the MSQ thin film is baked to volatilize most of the solvent in the MSQ thin film. At a relative high temperature, a baking step is performed to volatilize all of the solvent. The purpose of this two sections heating method is to prevent from forming bubbles that may damage the organic silicon material while the solvent volatilize too fast. The wafer is then disposed in a furnace at a temperature of about 400° C.

for curing the organic silicon material, so that the bonds thereof can be cured. The operation time for baking and curing depends the coating thickness of the MSQ thin film and the content of the solvent.

An oxygen plasma treatment is then performed on the cured MSQ thin film. The condition for the oxygen plasma treatment comprises an oxygen gas with a flow rate of about 300–500 sccm, a pressure of about 400–600 mtorr, an energy of about 100–400 W and a temperature at about 150–350° C. The duration for the oxygen plasma treatment depends on the thickness of the MSQ thin film. A chemical mechanical polishing step is performed on the MSQ thin film using the slurry for polishing silicon dioxide.

After the chemical mechanical polishing step, an ammonia plasma treatment is performed on the MSQ thin film. The conditions of the ammonia plasma treatment includes an ammonia gas with a flow rate of about 600–800 sccm, a pressure of about 200–400 mtorr, an energy of about 150–250 W, a temperature of about 150–350° C., and the operation time is about 3–12 minutes, preferably about 9–12 minutes.

It is appreciated that, though the embodiment discloses only the MSQ material as an example, the planarization method provided in the invention may also apply to other organic silicon materials that include the Si—$R_n$ (R is the functional group, and n equals to 1 or 2). As these kinds of materials have similar bonding structure after performing the oxygen plasma as the MSQ material, so that the ammonia plasma can mend the damages of these materials after performing chemical mechanical polishing process.

TABLE 1

| Reaction gas | Processing Time (minutes) | Flow rate (sccm) | Pressure (mtorr) | Energy (W) | Temperature (0° C.) |
|---|---|---|---|---|---|
| $O_2$ | Depending on film thickness | 400 | 500 | 120 | 250 |
| $NH_3$ | 3,6 & 9 | 700 | 300 | 200 | 300 |

Table 1 shows the conditions for generating oxygen plasma and ammonia plasma. In this example, the IC 1400 polishing pad manufactured by Rodel Corp. is used for chemical mechanical polishing, and the SS-25 slurry used for polishing silicon dioxide in industry is used.

Figure 3:
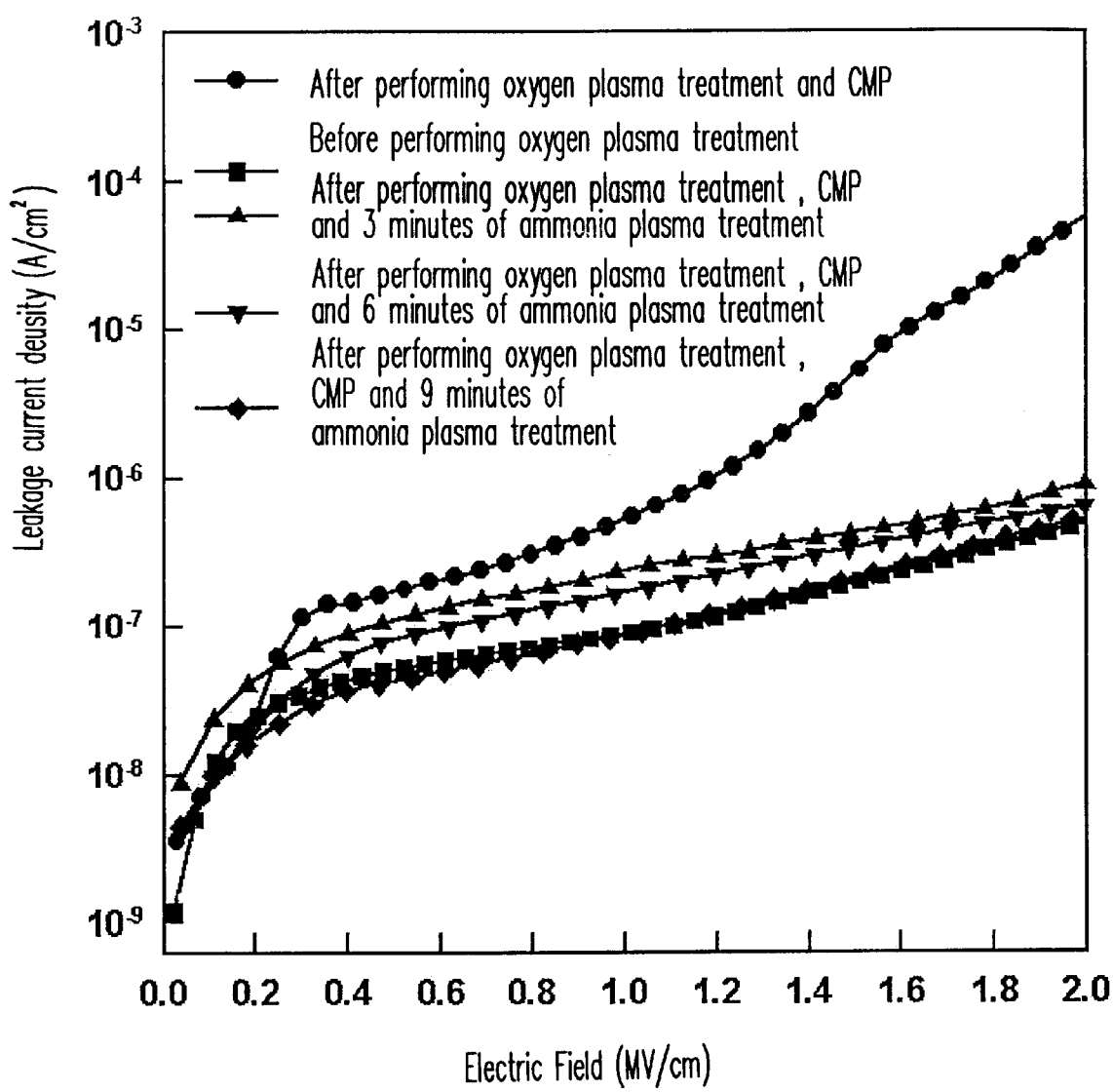
FIG. 3 shows a comparison of leakage current for MSQ thin film being performing with the oxygen treatment, chemical mechanical process and ammonia plasma treatment, MSQ thin film being performed with the oxygen treatment and chemical mechanical process and the MSQ thin film prior to performing the oxygen treatment, chemical mechanical polishing process and the ammonia plasma treatment.

In FIG. 3, a comparison in leakage current for the MSQ thin film being performed with the oxygen plasma treatment, CMP and ammonia plasma treatment with different operation time, the MSQ thin film being performed with only oxygen plasma treatment and CMP, and the MSQ thin film without performing all the above treatment is shown. The operation time of the ammonia plasma treatment includes 3 minutes, 6 minutes and 9 minutes. As shown in FIG. 3, the leakage current increase 1 to 2 order for the MSQ thin film being performed with only the oxygen plasma treatment and the CMP process. However, after performing 3 minutes of ammonia plasma treatment, the leakage current is greatly reduced. After 9 minutes of ammonia plasma treatment, the leakage current is almost the same as that of the MSQ thin film prior to all these three treatments.

FIG. 4 shows a comparison in dielectric constant for the MSQ thin film being performed with oxygen plasma treatment, CMP and ammonia plasma treatment with different processing time, the MSQ thin film being performed with oxygen plasma treatment and CMP only, and the MSQ thin film prior to any of the above treatments. As shown in FIG. 4, compared to the MSQ thin film (with a dielectric constant of 2.7) prior to any of the treatments, the MSQ thin film being performed with the CMP and oxygen plasma treatment only, the dielectric constant is increased to about 3.57. However, after 3 minutes of ammonia plasma treatment, the dielectric constant drops down to about 2.92, while the dielectric constant drops to 2.81, which is close to that prior to the treatments, after 9 minutes of ammonia plasma treatment.

Therefore, the invention provides an additional step of ammonia treatment after performing the oxygen treatment and the chemical mechanical polishing process. By this method, the carbon content can be removed from the organic silicon material with a low dielectric constant without causing scratched or non-uniformnity in the subsequent chemical mechanical polishing step. Furthermore, the leakage current and the dielectric constant are maintained at a value as it was prior to the oxygen plasma treatment.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of chemical mechanical polishing an organic silicon material with a low dielectric constant formed on a substrate, the method comprising:

forming an organic silicon material with a low dielectric constant on a substrate;

performing an oxygen plasma treatment to remove carbon content from the organic silicon material;

performing a step of chemical mechanical polish to planarze the organic silicon material; and performing a step of ammonia plasma to remove microscratches formed during the chemical mechanical polish, from the surface of the organic silicon material.

2. The structure according to claim 1, wherein the step of chemical mechanical polish comprises using a slurry used for polishing silicon dioxide.

3. The method according to claim 1, wherein the step of forming the organic silicon material on the substrate comprises a step of spin coating followed by a step of baking and curing.

4. The method according to claim 1, wherein the step of forming the organic silicon material comprises a step of forming a polysiloxane compound.

5. The method according to claim 4, wherein the step of forming the polysiloxane compound comprises a step of forming a methylsilsequioxane thin film.

6. The method according to claim 5, wherein the step of performing a ammonia plasma treatment comprises a step of providing an ammonia gas with a flow rate of about 600–800 sccm.

7. The method according to claim 5, wherein the step of performing the ammonia plasma treatment comprises a step of providing the ammonia plasma with a pressure between about 200–400 mtorr.

8. The method according to claim 5, wherein the step of performing the ammonia plasma treatment comprises a step of providing the ammonia plasma with an energy between about 150–250 W.

9. The method according to claim 5, wherein the step performing an ammonia plasma treatment comprises a step of providing an ammonia plasma at a temperature of about 150–350° C.

10. The method according to claim 5, wherein the step of performing an ammonia plasma treatment comprises a step of performing the ammonia plasma treatment for about 3–12 minutes.

11. The method according to claim 5, wherein the step of performing an ammonia plasma treatment comprises a step of performing the ammonia plasma treatment for about 9–12 minutes.

12. The method according to claim 5, wherein the step of performing the oxygen plasma treatment comprises providing the oxygen plasma with a flow rate of about 300–500 sccm.

13. The method according to claim 5, wherein the step of performing the oxygen plasma treatment comprises providing the oxygen plasma at a pressure between about 400–600 mtorr.

14. The method according to claim 5, wherein the step of performing an oxygen plasma treatment comprises providing the oxygen plasma with an energy of about 100–400 W.

15. The method according to claim 5, wherein the step of performing an oxygen plasma treatment comprises a step providing the oxygen plasma at a temperature of about 150–350° C.

16. A method of chemical mechanical polishing an organic silicon material with a low dielectric constant, the method comprises:

forming an organic silicon material with a low dielectric constant on a substrate;

performing an oxygen plasma treatment on the organic silicon material;

performing a chemical mechanical polishing process on the organic silicon material after the step of oxygen plasma treatment; and performing an ammonia plasma treatment on the organic silicon material to remove micro-scratches formed during the chemical mechanical polishing process, from the surface of the organic silicon material. temperature of about 150–350° C.

17. The method according to claim 16, wherein the step of forming the organic silicon material comprises a step of forming a polysiloxane compound.

18. The method according to claim 17, wherein the step of forming the polysiloxane compound comprises a step of forming a methylsilsequioxane thin film.

19. The method according to claim 17, wherein the step of forming the organic material comprises forming the polysiloxane compound having Si—$R_n$ (R is the functional group and n equals to 1 or 2).

* * * * *